United States Patent [19]

Koreeda

[11] Patent Number: 5,448,183
[45] Date of Patent: Sep. 5, 1995

[54] SEMICONDUCTOR INTEGRATED CIRCUIT DEVICE FOR CONVERTING PECL-SIGNAL INTO TTL-SIGNAL

[75] Inventor: Toshiyuki Koreeda, Kagoshima, Japan

[73] Assignees: Fujitsu Limited, Kawasaki; Kyushu Fujitsu Electronics Limited, Kagoshima, both of Japan

[21] Appl. No.: 113,692

[22] Filed: Aug. 31, 1993

[30] Foreign Application Priority Data

Feb. 8, 1993 [JP] Japan .................... 5-020166

[51] Int. Cl.6 ............... H03K 19/018; H03K 19/0175
[52] U.S. Cl. ........................... 326/33; 326/78; 326/67; 326/26
[58] Field of Search ............ 307/475, 443, 542, 542.1, 307/296.1, 296.4, 446, 454; 326/22–23, 26–27, 75, 31, 33, 78, 64, 67, 90, 109, 124, 126, 128

[56] References Cited

U.S. PATENT DOCUMENTS

| | | | |
|---|---|---|---|
| 5,049,763 | 9/1991 | Rogers | 307/443 |
| 5,149,991 | 9/1992 | Rogers | 307/443 |
| 5,153,457 | 10/1992 | Martin et al. | 307/475 |
| 5,184,034 | 2/1993 | Ohannes et al. | 307/446 |
| 5,204,554 | 4/1993 | Ohannes et al. | 307/443 |

*Primary Examiner*—Edward P. Westin
*Assistant Examiner*—Jon Santamauro
*Attorney, Agent, or Firm*—Nikaido, Marmelstein, Murray & Oram

[57] ABSTRACT

A semiconductor integrated circuit device has a first ground to which a first circuit is connected and whose level is fluctuate due to noise and a second ground to which a second circuit, which provides an output to the first circuit, is connected and whose level is stable. The semiconductor integrated circuit device includes a fluctuation detecting unit for detecting a fluctuation in the level of the first ground according to the level of the second ground serving as a reference; and a level controlling unit for controlling the level of the output of the second circuit, to cancel the fluctuation detected by the fluctuation detecting unit. The semiconductor integrated circuit device detects a fluctuation in the level of the first ground, which is easily affected by noise, according to the level of the second ground, which is stable, and controls the level of the output of the second circuit, to cancel the detected fluctuation. Consequently, this semiconductor integrated circuit device reduces the influence of noise and prevents malfunctions.

8 Claims, 11 Drawing Sheets

SEMICONDUCTOR INTEGRATED CIRCUIT DEVICE FOR CONVERTING PECL-SIGNAL INTO TTL-SIGNAL

BACKGROUND OF THE INVENTION

1. Field of the Invention

The present invention relates to a semiconductor IC (integrated circuit) device, and particularly, to a semiconductor IC device for converting a PECL (pseudo emitter-coupled logic) signal into a TTL (transistor-transistor logic) signal.

2. Description of the Related Art

A PECL circuit employs a single power source to convert an ECL (emitter-coupled logic) signal or a PECL signal into a TTL signal. If the ground potential level of a semiconductor IC device a fluctuates due to noise, the TTL output of the device will change and this will cause following circuits to malfunction. It is necessary, therefore, to provide a semiconductor IC device capable of canceling fluctuations in a ground potential level, to thereby prevent malfunctions.

SUMMARY OF THE INVENTION

An object of the present invention is to provide a semiconductor IC device that is capable of canceling fluctuations in a ground potential level, to prevent malfunctions.

According to the present invention, there is provided a semiconductor integrated circuit device comprising a first circuit connected to a first ground whose level is fluctuate due to noise; a second circuit, connected to a second ground whose level is stable, for providing an output to the first circuit; a fluctuation detecting unit for detecting a fluctuation in the level of the first ground according to the level of the second ground serving as a reference; and a level controlling unit for controlling the level of the output of the second circuit, to cancel the fluctuation detected by the fluctuation detecting unit.

The second circuit may be a PECL differential circuit to receive PECL-level differential signals, and the first circuit may be a TTL circuit to provide a TTL-level signal in response to the output of the PECL differential circuit. The TTL circuit may be a CMOS inverter circuit.

The fluctuation detecting unit and the level controlling unit may be made of two level compensating transistors to compensate positive and negative fluctuations in the TTL-level output of the first circuit.

The fluctuation detecting unit and the level controlling unit may be made of a level compensating transistor. The level compensating transistor may have a first electrode connected to the output of the second circuit, a second electrode connected to the first ground, and a control electrode connected to the second ground. The level compensating transistor may be an NPN bipolar transistor. The level compensating transistor may be an N-channel type MOS transistor.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments of the present invention, the problems of the prior art will be explained with reference to FIGS. 1 to 4.

Figure 1:
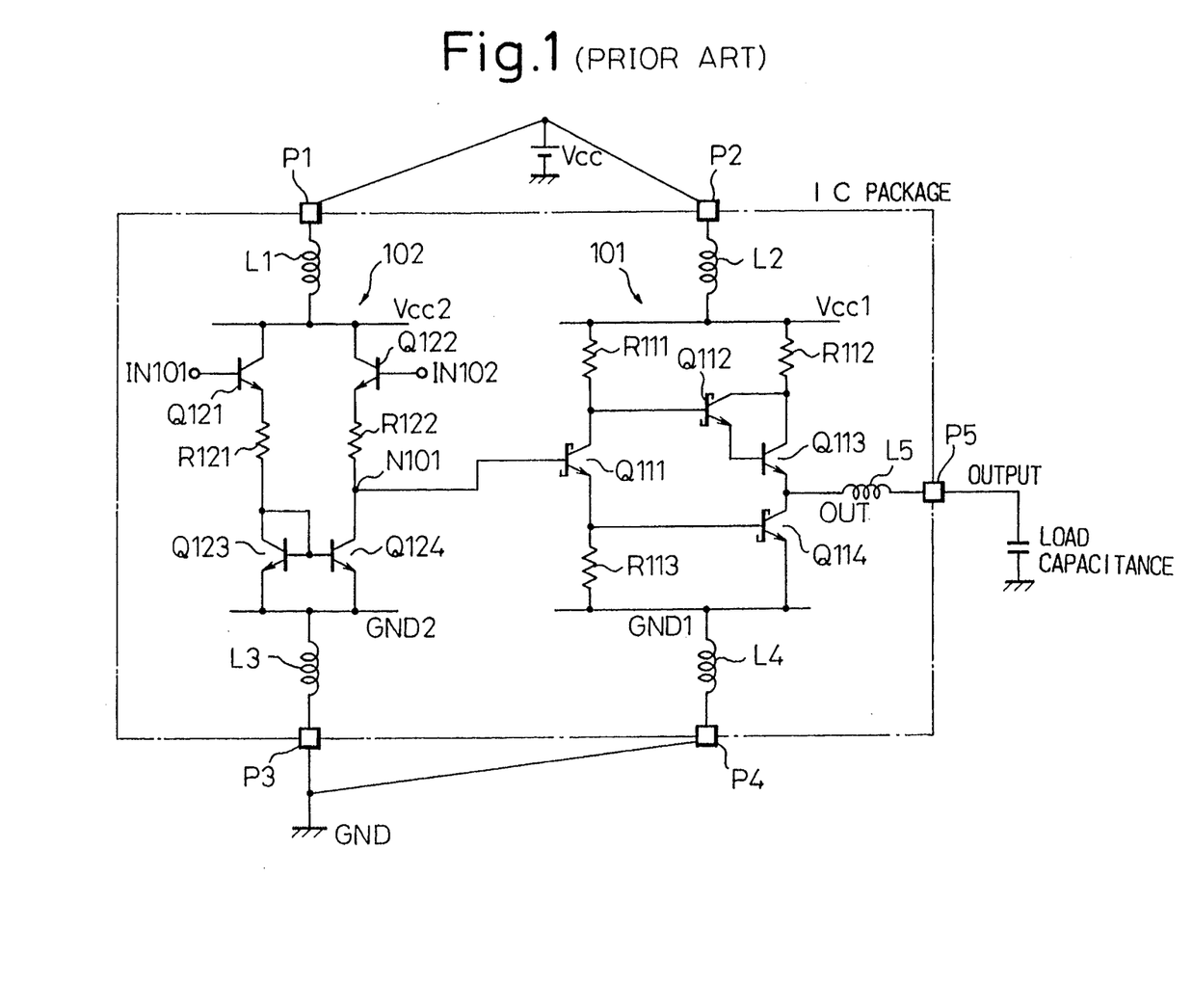
FIG. 1 is a circuit diagram showing a semiconductor IC device according to a prior art.

FIG. 1 is a circuit diagram showing a semiconductor IC device according to the prior art. Reference numeral 101 is a TTL circuit, 102 is a PECL differential circuit, P1, P2, P3, P4, and P5 are pads of an IC package of the semiconductor IC device, and L1, L2, L3, L4, and L5 are inductances of leads and bonding wires at the pads P1 to P5.

The TTL circuit 101 is connected to a ground GND1, and the PECL differential circuit 102 is connected to a ground GND2. The grounds GND1 and GND2 are electrically separated from each other in the IC chip and are connected to an external common ground GND through the inductances L3 and L4 and pads P3 and P4.

The TTL circuit 101 is connected to a power source Vcc1, and the PECL differential circuit 102 is connected to a power source Vcc2. The power sources Vcc1 and Vcc2 are electrically separated from each other in the IC chip and are connected to an external common power source Vcc through the inductances L1 and L2 and pads P1 and P2.

The TTL circuit 101 has NPN bipolar transistors Q113, an NPN bipolar transistor (normal type NPN bipolar transistor, or not having a SBD) Q111, Q112, and Q114 each having a Schottky barrier diode (SBD), and resistors R111, R112, and R113. The PECL differential circuit 102 has NPN bipolar transistors (normal type NPN bipolar transistors) Q121, Q122, Q123, and Q124 and resistors R121 and R122. The bases of the transistors Q121 and Q122 of the PECL differential circuit 102 form differential input terminals IN101 and IN102 to receive PECL-level differential signals. The transistors Q123 and Q124 form a current mirror circuit.

Figure 2:
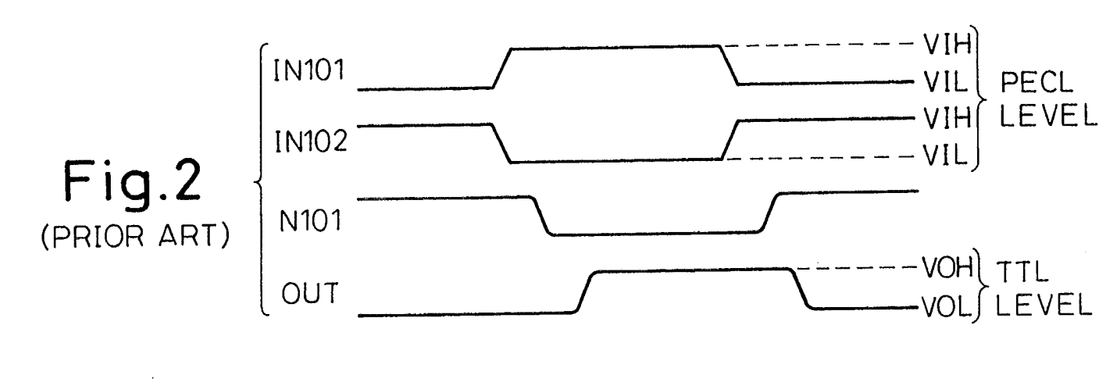
FIG. 2 shows waveforms at different parts of the semiconductor IC device of FIG. 1.

FIG. 2 shows waveforms at different parts of the semiconductor IC device of FIG. 1.

The PECL differential circuit 102 receives PECL-level signals through the differential input terminals IN101 and IN102 and converts them into currents. These currents and a voltage drop at the resistor R122 determine a level at a node N101. The level at the node N101 drives the transistor Q111 of the TTL circuit 101, to control a TTL-level signal provided from an output terminal OUT of the TTL circuit 101.

A base-emitter voltage of the transistor Q111 is VBE111, a base-emitter voltage of the transistor Q114 is VBE114, and a voltage at the node N101 is V101. If V101>VBE111+VBE114, the output terminal OUT provides a low level output VOL. If V101<VBE111+VBE114, the output terminal OUT provides a high level output VOH. The signals applied to the input terminals IN101 and IN102 are PECL-level voltages VIH and VIL, and the signal provided from the output terminal OUT is the TTL-level voltage VOH or VOL.

Figure 3:
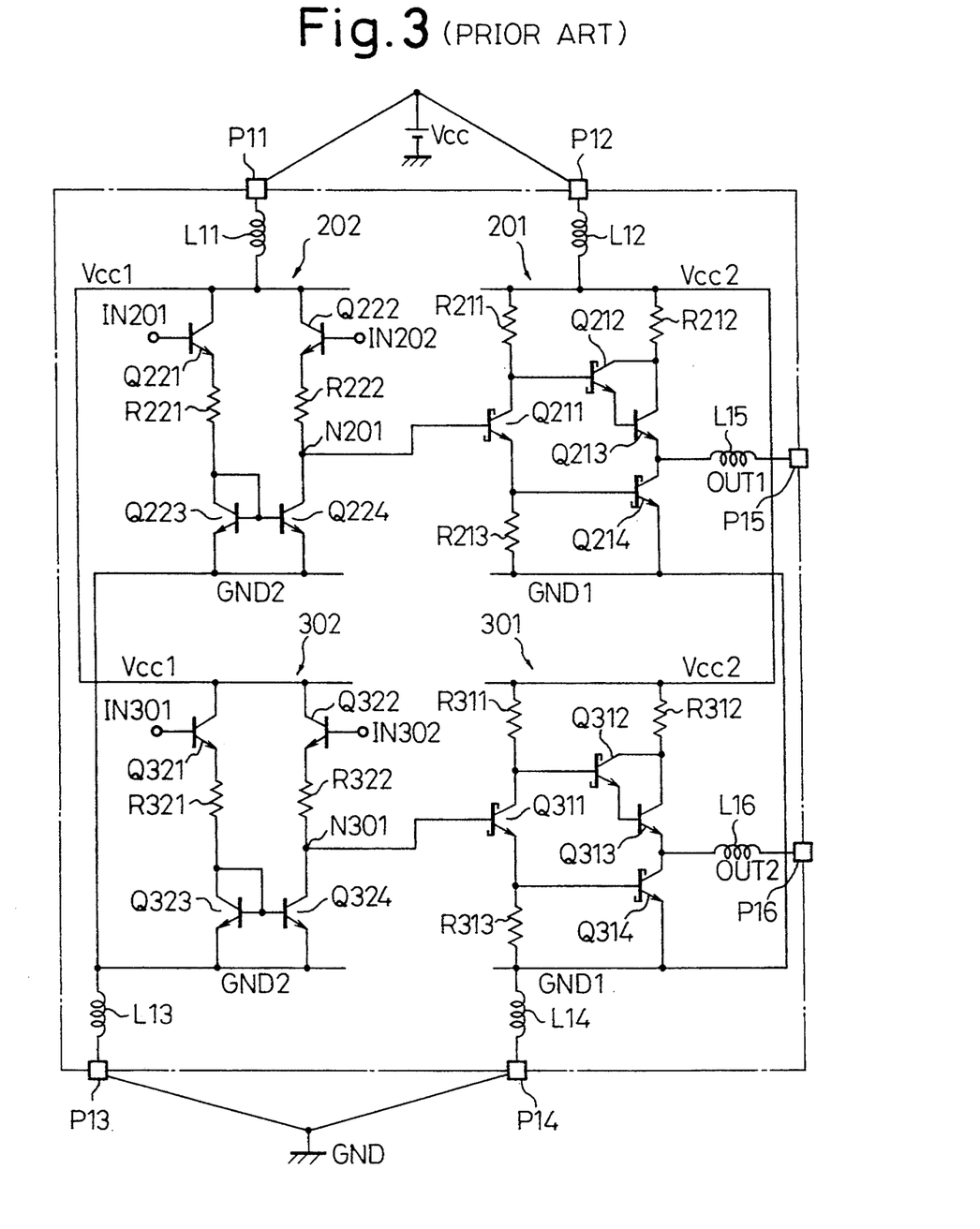
FIG. 3 is a circuit diagram showing a semiconductor IC device employing a plurality of circuit blocks each corresponding to the circuit of FIG. 1.

FIG. 3 is a circuit diagram showing a semiconductor IC device employing two circuit blocks each corresponding to the circuit of FIG. 1.

In the figure, circuits 201 and 301 correspond each to the TTL circuit 101 of FIG. 1, and circuits 202 and 302 each correspond to the PECL differential circuit 102 of FIG. 1. Namely, input terminals IN201 and IN202 (IN301 and IN302), transistors Q211 to Q214 (Q311 to Q314) and Q221 to Q224 (Q321 to Q324), and resistors R211 to R213 (R311 to R313), R221 (R321), and R222 (R322) correspond to the input terminals IN101 and IN102, transistors Q111 to Q114 and Q121 to Q124, and resistors R111 to R113, R111, and R112. Although the semiconductor IC device (IC package) of FIG. 3 has two circuit blocks each corresponding to the circuit of FIG. 1, an actual semiconductor IC device may have many such circuit blocks.

Figure 4:
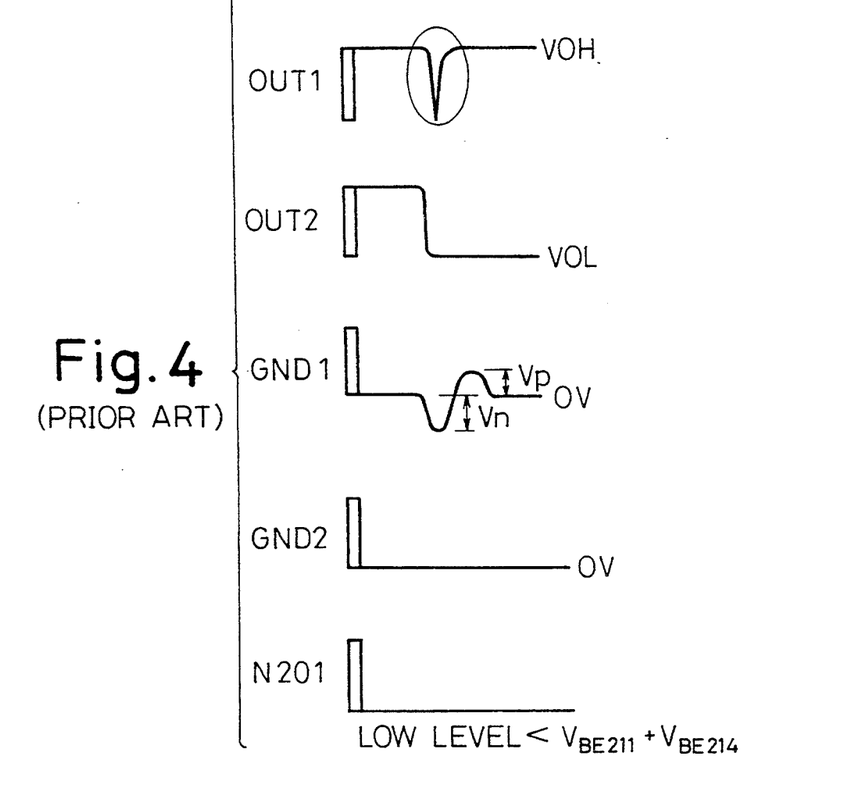
FIG. 4 shows waveforms explaining the problems of the semiconductor IC device of FIG. 3.

FIG. 4 shows waveforms explaining the problems of the semiconductor IC device of FIG. 3. While a first output OUT1 from a pad P15 of the device is at a HIGH level, a second output OUT2 from a pad P16 may change from HIGH level to LOW level. In this case, the first output OUT1 suffers a momentary fluctuation. Namely, when the level of the second output OUT2 changes from HIGH to LOW, the level of a first ground GND1 of the TTL circuit 301 fluctuates negatively by Vn volts and positively by Vp volts from an original zero volts due to the inductance L14, etc.

A second ground GND2 of the PECL differential circuits 202 and 302 is separated from the first ground GND1 in the IC chip, and the grounds GND1 and GND2 are connected to an external common ground GND. As shown in FIG. 4, the level of the second ground GND2 is stable, and therefore, a voltage at a node N201 (N301) is stable.

The base-emitter voltage of the transistor Q211 is VBE211, the base-emitter voltage of the transistor Q214 is VBE214, and the voltage at the node N201 is V201. Then, the first output OUT1 will provide a high level TTL output VOH, if the following condition is satisfied:

$$V201 < VBE211 + VBE214 \quad (1)$$

This condition will be satisfied if the level of the ground GND1 of the TTL circuit 201 is stable at zero volts.

When the level of the second output OUT2 changes from HIGH to LOW, the level of the first ground GND1 of the TTL circuit 301 that is connected to the ground GND1 of the TTL circuit 201 fluctuates. Then, the condition (1) will be changed as follows:

$$V201 < VBE211 + VBE214 + Vn \quad (2)$$

Depending on the magnitude of the negative fluctuation voltage Vn, the following condition will be met:

$$V201 > VBE211 + VBE214 + Vn \quad (3)$$

If the inequality (3) stands depending on the negative fluctuation voltage Vn, the first output OUT1 will cause a negative momentary fluctuation to make a following circuit, connected to the output OUT1, malfunction.

The larger the capacitance of the load at the output terminal of the TTL circuit and the greater the number of TTL outputs that fluctuate, the larger the fluctuation voltage Vn (Vp) that influences the level of the ground GND1. As the input capacitance and wiring capacitance of the downstream circuits connected to the output terminals OUT1 and OUT2 of the semiconductor IC device increase, or as the number of TTL circuits connected to the same first ground GND1 increases, the malfunctions mentioned above will occur more frequently.

Next, the preferred embodiments of the present invention will be explained with reference to the drawings.

Figure 5:
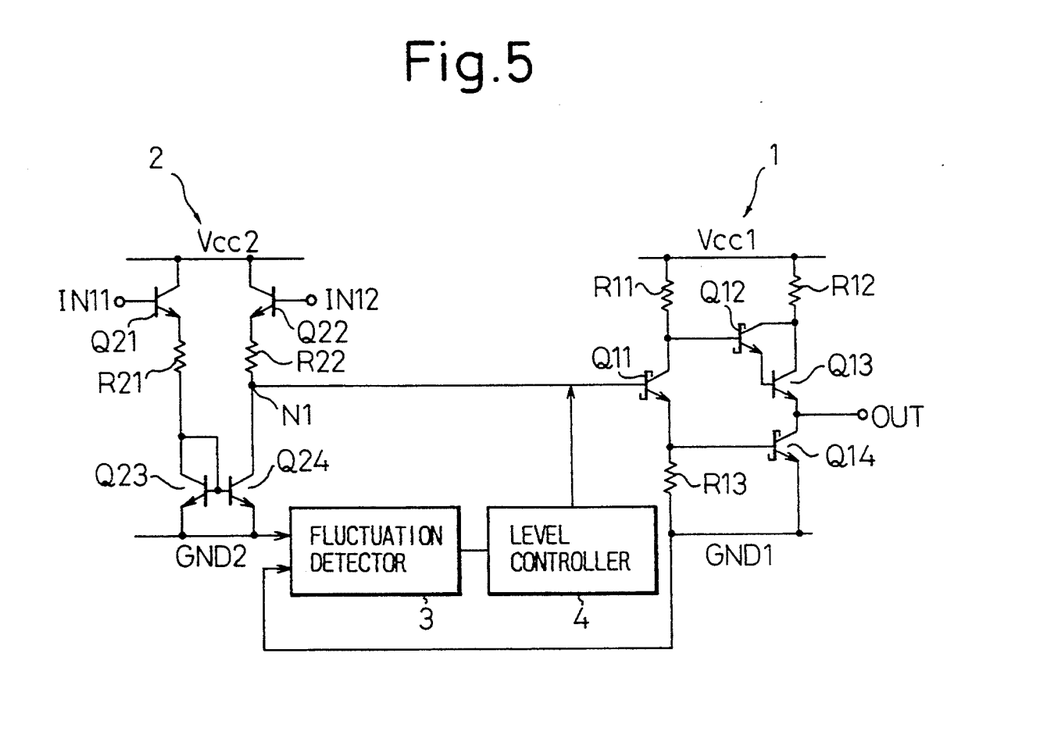
FIG. 5 is a circuit diagram showing the principle of a semiconductor IC device according to the present invention.

FIG. 5 is a circuit diagram showing the principle of a semiconductor IC device according to the present invention. This device has a first ground GND1 to which a first circuit 1 is connected and whose level may fluctuate due to noise and a second ground GND2 to which a second circuit 2, which supplies an output N1 to the first circuit 1, is connected and whose level is stable. According to the present invention, the semiconductor device has a fluctuation detector for detecting a fluctuation in the level of the first ground GND1 according to the level of the second ground GND2 serving as a reference, as well as a level controller 4 for controlling the level of the output N1 of the second circuit 2 in a way to cancel the fluctuation detected by the fluctuation detector 3.

The fluctuation detector 3 uses the second GND2, which is stable, as a reference, to detect a fluctuation in the first ground GND1. The level controller 4 controls the level of the output N1 of the second circuit 2, to cancel the fluctuation detected by the fluctuation detector 3. Consequently, the present invention removes the influence of noise from the ground GND1 and prevents malfunctions.

Figure 6:
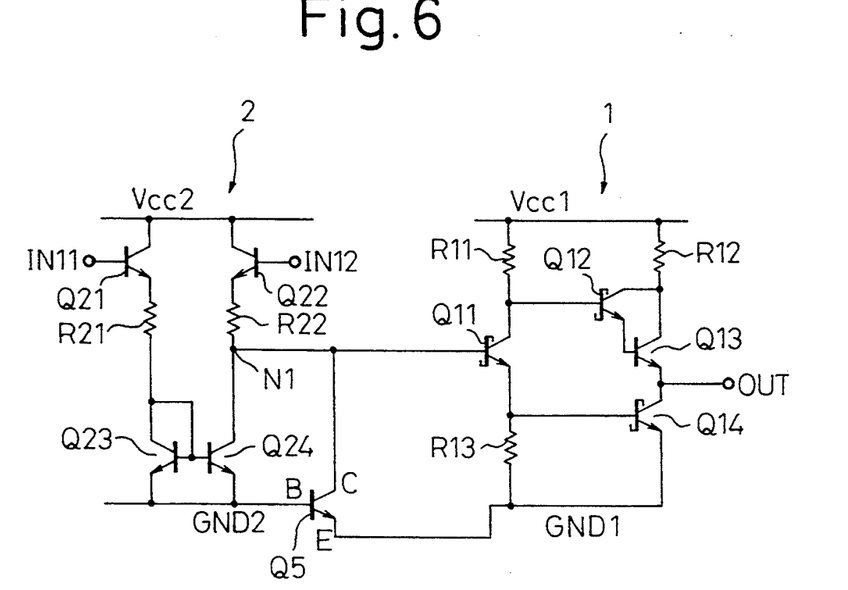
FIG. 6 is a circuit diagram showing a semiconductor IC device according to a first embodiment of the present invention.

FIG. 6 is a circuit diagram showing a semiconductor IC device according to an embodiment of the present invention. Numeral 1 is a TTL circuit, 2 is a PECL differential circuit, GND1 is a ground for the TTL circuit 1, and GND2 is a ground for the PECL differential circuit 2. These grounds GND1 and GND2 are electrically separated from each other in the IC chip and are connected to an external common ground GND through wining inductances (L3, L4) and pads (P3, P4).

The TTL circuit 1 has a power source Vcc1, and the PECL differential circuit 2 has a power source Vcc2. The power sources Vcc1 and Vcc2 are electrically separated from each other in the IC chip and are connected to an external common power source Vcc through wining inductances (L1, L2) and pads (P1, P2).

The TTL circuit 1 has NPN bipolar transistors Q11, Q12, and Q14 each having a Schottky barrier diode (SBD) an NPN bipolar transistor (normal type NPN bipolar transistor, or not having a SBD), Q13, and resistors R11, R12, and R13. The PECL differential circuit 2 has NPN bipolar transistors (normal type NPN bipolar transistors) Q21, Q22, Q23, and Q24 and resistors R21 and R22.

The bases of the transistors Q21 and Q22 of the PECL differential circuit 2 form differential input terminals IN11 and IN12 to receive PECL-level differential signals. The transistors Q23 and Q24 form a current mirror circuit.

The arrangements and operations of TTL circuit 1 and PECL differential circuit 2 are the same as those of FIG. 1. The semiconductor IC device of the embodiment of FIG. 6 further has an NPN bipolar transistor Q5. This transistor has an emitter E connected to the first ground GND1 of the TTL circuit 1, a base B connected to the second ground GND2 of the PECL differential circuit 2, and a collector C connected to an output node N1 of the PECL differential circuit 2.

The level of the second ground GND2 is stable at about zero volts, while the level of the first ground GND1 may fluctuate.

While an output terminal OUT of the TTL circuit 1 is providing a high-level output VOH, the level of the first ground GND1 may cause a fluctuation of Vn, if a condition of V1>VBE11+VBE14+Vn is established. Here, V1 is a voltage at the node N1, VBE11 is a base-emitter voltage of the transistor Q11, and VBE14 is a base-emitter voltage of the transistor Q14. If such condition is established, the transistor Q5 turns ON to decrease the potential at the node N1, to set V1<V-BE11+VBE14+Vn, thereby causing no fluctuation in the high-level output VOH provided from the output terminal OUT of the TTL circuit 1.

In this way, the transistor Q5 has a function of detecting a fluctuation (a negative fluctuation Vn) in the level of the first ground GND1 according to the level of the second ground GND2, as well as a function of controlling the potential of the node N1 in a way to cancel the detected fluctuation.

Figure 7:
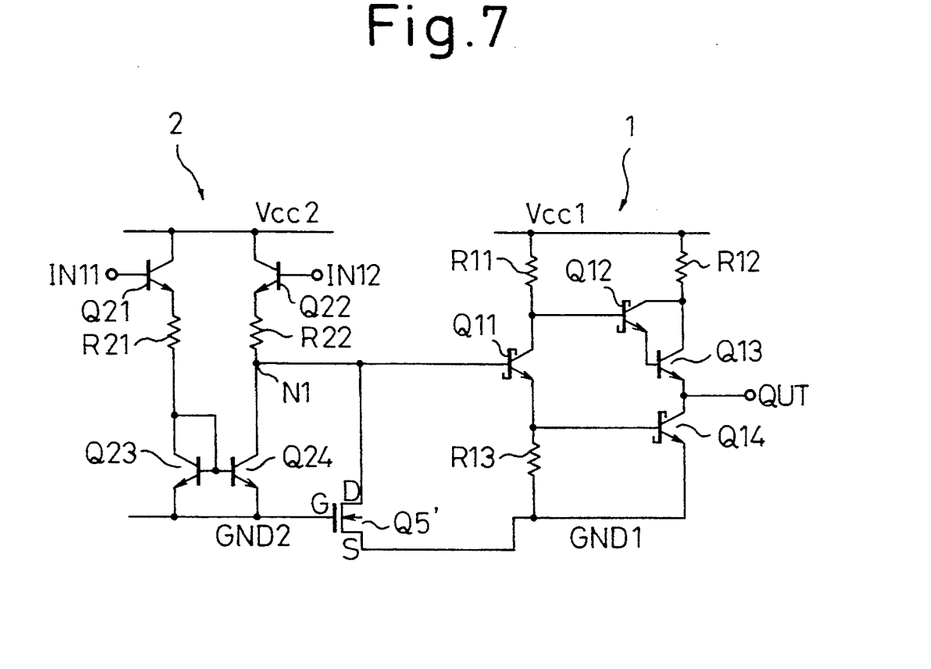
FIG. 7 is a circuit diagram showing a modification of the semiconductor IC device of FIG. 6.

FIG. 7 is a circuit diagram showing a modification of the semiconductor IC device of FIG. 6. In place of the NPN bipolar transistor Q5 of FIG. 6, the modification of FIG. 7 employs a large N-channel MOS transistor Q5'. This transistor Q5' has a source S connected to a first ground GND1, a gate G connected to a second ground GND2, and a drain D connected to a node N1. The operations of the transistor Q5' of FIG. 7 are the same as those of the transistor Q5 of FIG. 6.

Figure 8:
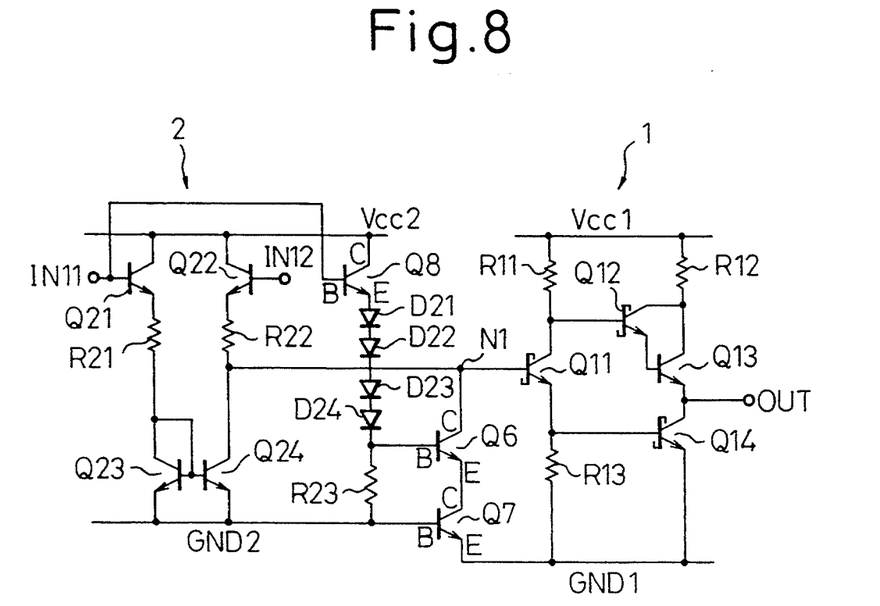
FIG. 8 is a circuit diagram showing a semiconductor IC device according to another embodiment of the present invention.

FIG. 8 is a circuit diagram showing a semiconductor IC device according to another embodiment of the present invention. Compared with the device of FIG. 1, the device of FIG. 8 additionally has NPN bipolar transistors Q6 to Q8, diodes D21 to D24, and a resistor R23.

The transistor Q8 has a collector C connected to a second power source Vcc2 of a PECL differential circuit 2, a base connected to an input terminal IN11, and an emitter E connected to a second ground GND2 of the PECL differential circuit 2 through the forwardly connected four diodes D21 to D24 and the resistor R23.

The transistor Q6 has a collector C connected to an output node N1 of the PECL differential circuit 2, a base B connected to a node between the diode D24 and the resistor R23, and an emitter E connected to a collector C of the transistor Q7. This transistor Q7 has a base B connected to the second ground GND2 and an emitter E connected to a first ground GND1 of a TTL circuit 1. The transistor Q7 corresponds to the transistor Q5 of FIG. 6, and the operations thereof are the same as those of the transistor Q5. When a positive fluctuation Vp occurs in the level of the first ground GND1, the transistor Q6 turns OFF, to cancel the fluctuation Vp.

Unlike the circuits of FIGS. 6 and 7 that hardly cancel a positive fluctuation in a TTL output caused by a positive fluctuation in the first ground GND1, the circuit of FIG. 8 is capable of cancelling such positive fluctuation that may occur in a low-level output of the TTL circuit 1. The diodes D21 to D24 are level shifting diodes to change the level of a signal supplied to an input terminal IN11 into a voltage level that is proper for the base of the transistor Q6. The transistor Q8 is used to stop the transistor Q6 turning ON regardless the level of the signal supplied to the input terminal IN11.

Figure 9:
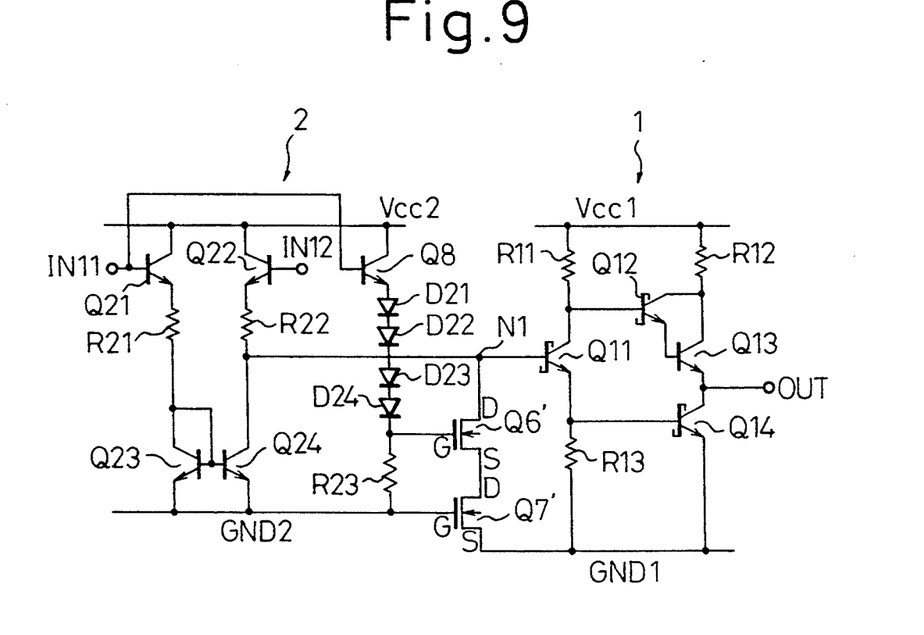
FIG. 9 is a circuit diagram showing a modification of the semiconductor IC device of FIG. 8.

FIG. 9 is a circuit diagram showing a modification of the semiconductor IC device of FIG. 8. In place of the NPN bipolar transistors Q6 and Q7 of FIG. 8, the modification of FIG. 9 employs large N-channel MOS transistors Q6' and Q7'. The transistor Q6' has a drain D connected to a node N1, a gate G connected to a node between a diode D24 and a resistor R23, and a source S connected to a drain D of the transistor Q7'. The transistor Q7' has a gate G connected to a second ground GND2 and a source S connected to a first ground GND1. The operations of the MOS transistors Q6' and Q7' are the same as those of the bipolar transistors Q6 and Q7 of FIG. 8.

Figure 10:
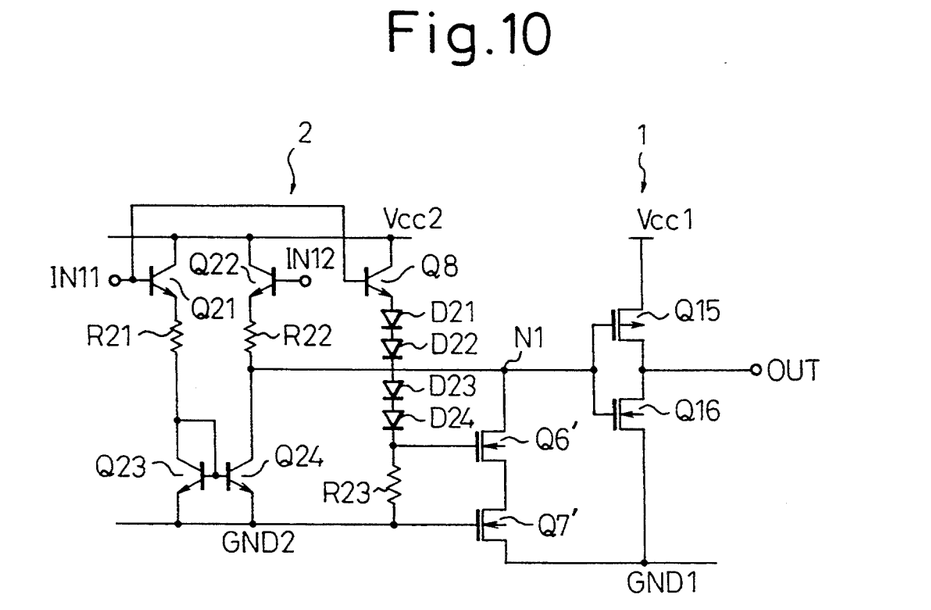
FIG. 10 is a circuit diagram showing another modification of the semiconductor IC device of FIG. 8.

FIG. 10 is a circuit diagram showing another modification of the semiconductor IC device of FIG. 8. In place of the TTL circuit 1 of FIG. 9, the modification of FIG. 10 employs an inverter circuit made of CMOS transistors Q15 and Q16.

Figure 11:
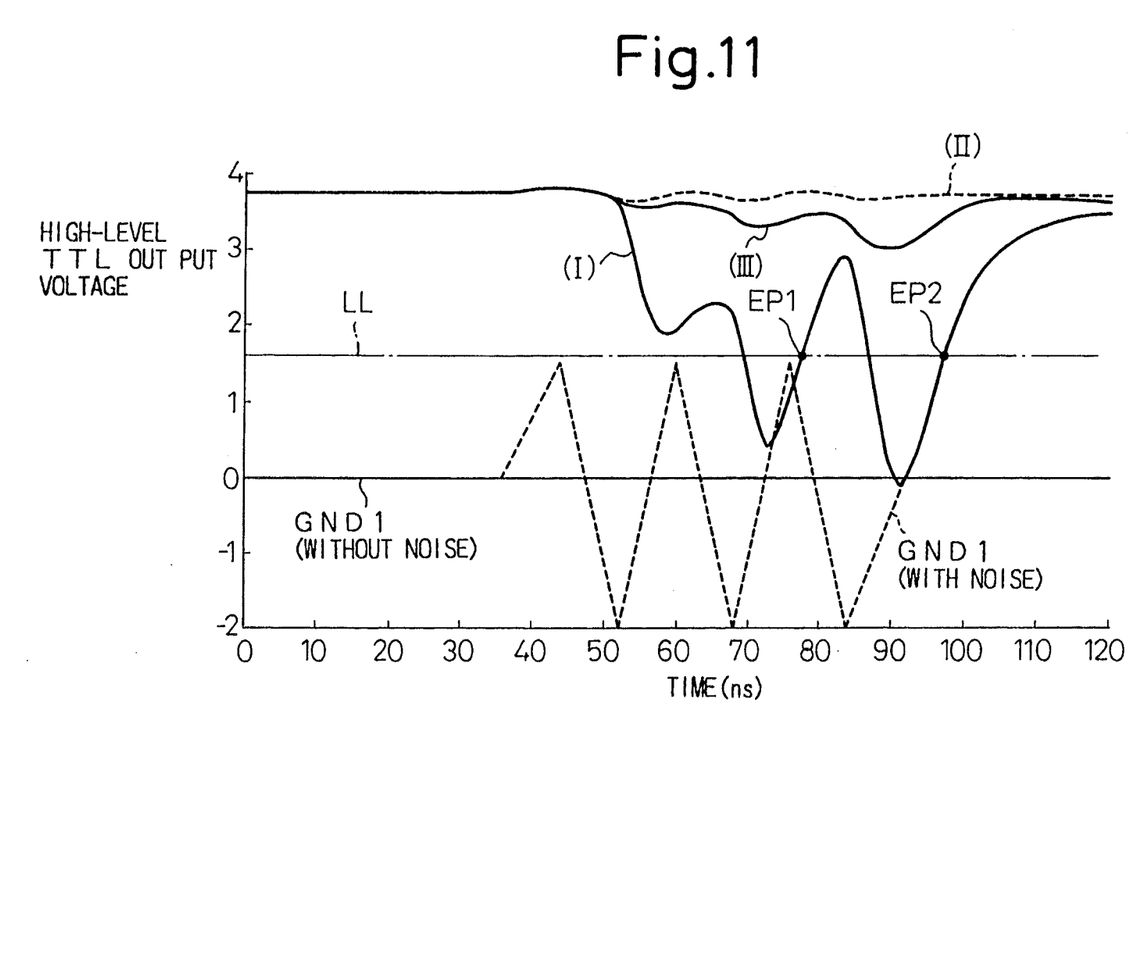
FIG. 11 shows results of simulations of the characteristics of the semiconductor IC devices according to the present invention and prior art.

FIG. 11 shows results of simulations of the characteristics of the semiconductor IC devices according to the present invention and the prior art. Reference marks I to III indicate high-level outputs of the TTL circuits of the respective devices with noise being applied to the first ground GND1. The waveform I is of the prior art of FIG. 1, and the waveforms II and III are of the embodiments of the present invention of FIGS. 6 and 8.

If a positive-edge-triggered flip-flop circuit (a sequential circuit) is connected to the output terminal of the TTL circuit of each of the IC devices, the prior art (I) will erroneously activate the flip-flop circuit due to a fluctuation in the level of the first ground GND1 that changes the output level of the TTL circuit. Namely, the characteristic curve I of the prior art crosses an input threshold voltage (Vth) LL of the flip-flop circuit at intersections EP1 and EP2, to erroneously activate the flip-flop circuit at these intersections.

On the other hand, the characteristic curves II and III of the present invention never cross the input threshold voltage LL of the flip-flop circuit, and therefore, never erroneously activate the flip-flop circuit.

The embodiment of FIG. 8 having the characteristic curve III is capable of cancelling positive and negative fluctuations in the level of the first ground GND1. The embodiment of FIG. 6 is capable of cancelling only a negative fluctuation in the level of the first ground GND1. As the characteristic curves II and III tell, the embodiment of FIG. 8 is affected by fluctuations in the level of the first ground GND1 more than the embodiment of FIG. 6. The embodiment of FIG. 8, however, never erroneously activates the downstream circuit, as the embodiment of FIG. 8 can cancel both positive and negative fluctuations in the first ground GND1.

In summary, the present invention provides a semiconductor IC device that detects a fluctuation in the level of a first ground, which is easily affected by noise, relative to the level of a second ground, which is stable, and controls the level of a predetermined signal to cancel the detected fluctuation. Consequently, the device according to the present invention reduces the influence of noise and prevents malfunctions.

Many different embodiments of the present invention may be constructed without departing from the spirit and scope of the present invention, and it should be understood that the present invention is not limited to the specific embodiments described in this specification, except as defined in the appended claims.

I claim:

1. A semiconductor integrated circuit device comprising:
   a first circuit connected to a first ground whose level fluctuates due to noise, said first circuit providing a TTL-level signal;
   a second circuit, connected to a second ground whose level is stable, for providing an output to said first circuit, said second circuit being connected to receive PECL-level differential signals;
   a fluctuation detecting means for detecting a fluctuation in the level of said first ground according to the level of said second ground serving as a reference; and
   a level controlling means for controlling the level of the output of said second circuit, to cancel the fluctuation detected by said fluctuation detecting means.

2. A semiconductor integrated circuit device as claimed in claim 1, wherein said first circuit provides said TTL-level signal in response to the output of said PECL differential circuit.

3. A semiconductor integrated circuit device as claimed in claim 2, wherein said first circuit is a an inverter, circuit comprising MOS transistors.

4. A semiconductor integrated circuit device as claimed in claim 1, wherein said fluctuation detecting means and said level controlling means are commonly made of two level compensating transistors to compensate positive and negative fluctuations in the TTL-level output of said first circuit.

5. A semiconductor integrated circuit device as claimed in claim 1, wherein said fluctuation detecting means and said level controlling means are commonly made of a level compensating transistor.

6. A semiconductor integrated circuit device as claimed in claim 5, wherein said level compensating transistor has a first electrode connected to the output of said second circuit, a second electrode connected to said first ground, and a control electrode connected to said second ground.

7. A semiconductor integrated circuit device as claimed in claim 6, wherein said level compensating transistor is an NPN bipolar transistor.

8. A semiconductor integrated circuit device as claimed in claim 6, wherein said level compensating transistor is an N-channel type $\overline{\text{MOS}}$ transistor.

* * * * *